US010876456B2

(12) United States Patent
Junio et al.

(10) Patent No.: US 10,876,456 B2
(45) Date of Patent: Dec. 29, 2020

(54) THERMOELECTRIC HEAT ENERGY RECOVERY MODULE GENERATOR FOR APPLICATION IN A STIRLING-ELECTRIC HYBRID AUTOMOBILE

(71) Applicant: Quantum Industrial Development Corporation, Seguin, TX (US)

(72) Inventors: Mark A. Junio, San Antonio, TX (US); Terry R. McCauley, Spring Branch, TX (US); Joseph S. McDowell, San Antonio, TX (US); Victoria A. Watson, San Antonio, TX (US); Mirley K. Balasubramanya, San Antonio, TX (US)

(73) Assignees: Quantum Industrial Development Corp., Seguin, TX (US); Texas A&M University, College Station, TX (US)

( * ) Notice: Subject to any disclaimer, the term of this patent is extended or adjusted under 35 U.S.C. 154(b) by 3 days.

(21) Appl. No.: 16/387,920

(22) Filed: Apr. 18, 2019

(65) Prior Publication Data

US 2020/0025053 A1 Jan. 23, 2020

Related U.S. Application Data

(63) Continuation-in-part of application No. 15/330,341, filed on Sep. 1, 2016, now abandoned.

(51) Int. Cl.
*F01N 5/02* (2006.01)
*F02G 1/043* (2006.01)
*H01L 35/30* (2006.01)
*H01L 35/32* (2006.01)
*B60K 6/24* (2007.10)

(52) U.S. Cl.
CPC ............. *F01N 5/025* (2013.01); *F02G 1/043* (2013.01); *H01L 35/30* (2013.01); *H01L 35/32* (2013.01); *B60K 6/24* (2013.01); *B60Y 2200/92* (2013.01); *B60Y 2400/206* (2013.01); *B60Y 2400/43* (2013.01)

(58) Field of Classification Search
CPC ........ F01N 3/02; F01N 5/025; F01N 2590/11; F02G 1/043; H01L 35/30; H01L 35/32; B60K 6/24; B60Y 2200/92; B60Y 2400/206; B60Y 2400/43
See application file for complete search history.

(56) References Cited

U.S. PATENT DOCUMENTS 6,986,247 B1 * 1/2006 Parise .................. F01N 3/2046
60/284

* cited by examiner

*Primary Examiner* — Brandon D Lee
(74) *Attorney, Agent, or Firm* — John A. Fortkort; Fortkort & Houston PC

(57) ABSTRACT

A vehicle is provided which includes a Stirling Cycle engine that generates a flow of exhaust gases from the external combustion of a fuel supply. The vehicle is equipped with a thermoelectric generator module which is in fluidic communication with the flow of exhaust gases generated by the Stirling Cycle engine. The thermoelectric generator module includes a thermopile array, and generates electrical energy from the thermal energy in the flow of exhaust gases.

20 Claims, 5 Drawing Sheets

THERMOELECTRIC HEAT ENERGY RECOVERY MODULE GENERATOR FOR APPLICATION IN A STIRLING-ELECTRIC HYBRID AUTOMOBILE

CROSS REFERENCE TO RELATED APPLICATION

This application is a continuation-in-part of U.S. patent application Ser. No. 13/330,341, filed Sep. 1, 2016, having the same title, and which is incorporated herein by reference in its entirety.

TECHNICAL FIELD OF THE DISCLOSURE

The present invention pertains generally to hybrid vehicles, and more particularly to a Stirling electric hybrid vehicle equipped with a thermoelectric heat energy recovery module.

BACKGROUND OF THE DISCLOSURE

Thermopile technology is based upon the thermoelectric effect, or Seebeck effect. By applying a temperature difference to a pair of dissimilar metallic junctions in an electrical circuit, an electrical voltage is generated. Thermopiles have been used by the U.S. Department of Energy and the National Aeronautics and Space Administration (NASA) in a variety of applications to generate electrical power from a variety of heat sources, including radio isotopes. These applications include radio-thermal generators (RTGs) for remote power supplies for equipment deployed in Antarctica, and power supplies for spacecraft such as the Pioneer 10 Spacecraft. Thermopiles have been shown to be more efficient as $\Delta T$ increases.

SUMMARY OF THE INVENTION

In one aspect, a vehicle is provided which comprises a Stirling Cycle engine which generates a flow of exhaust gases from the external combustion of a fuel supply; and a thermoelectric generator module which is in fluidic communication with the flow of exhaust gases generated by the Stirling Cycle engine; wherein said thermoelectric generator module is equipped with a thermopile array and generates electrical energy from the thermal energy in the flow of exhaust gases.

In another aspect, a thermoelectric heat energy recovery module is provided in combination with a Stirling cycle engine equipped with an exhaust line. The heat energy recovery module comprises (a) a conduit having a wall and equipped with an inlet and an outlet, wherein said inlet and outlet are in fluidic communication with each other by way of an interior space enclosed by said wall, wherein said inlet is fluidically coupled to the exhaust line of the Stirling cycle engine, and wherein said outlet is in fluidic communication with the environment external to said wall; and (b) first and second sets of heat sink pins which extend from said wall and into said interior space in first and second opposing directions, respectively; wherein said first and second sets of heat sink pins are disposed in first and second opposing arrays, respectively, wherein each heat sink pin in the first array is disposed in an opposing and spaced-apart relationship to a heat sink pin in the second array, and wherein the heat sink pins in the first and second arrays are arranged in rows such that any two adjacent heat sink pins in each row have different lengths as measured by the distance each heat sink pin extends from the wall.

In a further aspect, a method is provided which comprises (a) generating a flow of exhaust gases from the external combustion of a fuel supply with a Stirling Cycle engine; and (b) generating electrical energy from the flow of exhaust gases generated by the Stirling Cycle engine by passing the flow of exhaust gases through a thermoelectric generator module which is equipped with a thermopile array and which generates electrical energy from the thermal energy in the flow of exhaust gases.

BRIEF DESCRIPTION OF THE DISCLOSURE

For a more complete understanding of the present invention and the advantages thereof, reference is now made to the following description taken in conjunction with the accompanying drawings in which like reference numerals indicate like features.

DETAILED DESCRIPTION OF THE DISCLOSURE

Figure 1:
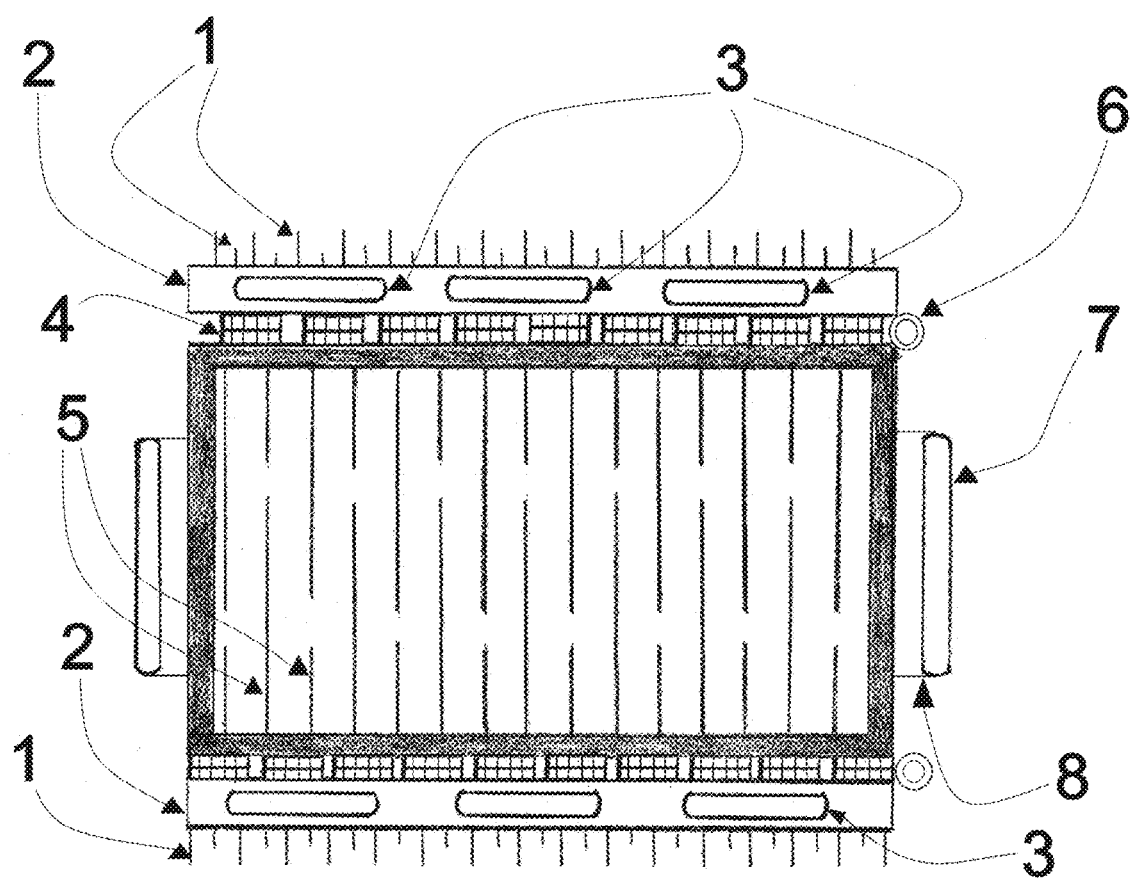
FIG. 1 is a diagrammatic view of the outlet end of the Thermoelectric Heat Energy Recovery Module (THERMO) Generator device for application in a Stirling-Electric Hybrid vehicle in accordance with the teachings herein.

Although thermopiles provide a useful means for generating electrical energy, they also represent additional design and materials constraints and complications which must be offset by the prospective amount of electrical energy they will generate in a specific application. The situation is analogous to the use of photovoltaic cells to harvest solar energy, where the cost of the cells may be economically justified in regions that experience a lot of sunny days, but may not be justified in regions that experience relatively few sunny days.

For example, thermopiles could potentially be utilized to recover waste heat from automotive exhaust streams. However, this application is challenging in that the temperatures of exhaust gases generated by internal combustion engines can reach 800° C. when measured at the exhaust manifold. Many heat sink materials that could otherwise be used for thermopile applications are not stable at these temperatures. On the other hand, many conventional heat sink materials which are stable at these high temperatures are not as thermally conductive as they are at lower temperatures. This decrease in thermal conductivity results in a less favorable $\Delta T$ across the thermopile for the generation of electrical voltage, and thus adversely affects the amount of electrical energy that can be harvested from the exhaust stream.

For example, aluminum has a high thermal conductivity, and thus is a good choice for a heat sink material in a thermopile array for many applications. However, aluminum has a melting point of 660° C., and thus is unsuitable for use as a heat sink material at the temperatures typically found in an internal combustion engine. Other materials, such as iron, can withstand the temperatures experienced in an internal combustion engine, but have a lower thermal conductivity than aluminum. Consequently, thermopile arrays based on iron will typically provide a lower yield of electrical energy than their aluminum counterparts, which may not justify the additional design and materials constraints that the thermopile array imposes.

It has now been found that thermopiles may be utilized with very favorable results to harvest thermal energy from the exhaust streams of hybrid vehicles equipped with an external combustion Stirling Cycle engine. In particular, the typical temperatures found in the exhaust streams produced by many external combustion Stirling Cycle engines is significantly lower than the temperatures found in the exhaust streams of typical internal combustion engines. Consequently, materials having higher thermal conductivities, such as aluminum, or aluminum composites with cubic boron nitride (Al (c-BN)), may be utilized as heat sink materials in thermopile arrays for this application. The use of these materials may result in higher yields of electrical energy due, for example, to the more favorable ΔT that exists across the thermopile array for the generation of electrical voltage. The thermal conductivities of the materials utilized preferably have thermal conductivities of at least 205 W/m K, and may have thermal conductivities within the range of 205 to 305 W/m K. Moreover, heat sinks (generally speaking) have a greater coefficient of thermal conductivity at lower temperatures. For example, there is roughly a 50% loss in thermal conductivity of a heat sink composed of iron at 800° C. when compared to the thermal conductivity of the same material at 200° C. Hence, even if the thermopile is constructed with a heat sink material (such as iron) that is capable of use with an internal combustion engine, the thermopile may exhibit better performance (such as, for example, higher yields of electrical energy) at the lower exhaust gas temperatures encountered with a Stirling Cycle engine.

Additional improvements may be achieved by providing a turbulent or micro turbulent flow of exhaust gases across the thermopile array, which may improve heat energy transfer rates from the exhaust gases to the thermopile array. This may be achieved, for example, by creating a tortuous or convoluted flow path across the thermopile array.

In a preferred embodiment of the systems, devices and methodologies disclosed herein, a thermoelectric generator module for a Stirling-Electric Hybrid Automobile is provided. The thermoelectric generator module includes a conduit which is equipped with an inlet and an outlet. The inlet of the conduit is in fluidic communication with the exhaust system of a Stirling Cycle engine. Thus, for example, the inlet may be attached to the exhaust manifold or exhaust pipe of the Stirling Cycle engine. The outlet of the conduit is in fluidic communication with the external atmosphere.

The thermoelectric generator module preferably has a construction which imparts a turbulent or micro turbulent flow to exhaust gases passing through it. In a preferred embodiment, this is achieved by equipping the thermoelectric generator module with a plurality of heat sink pins which are disposed within the conduit. These heat sink pins may be of varying lengths, and may be arranged in a plurality of alternating offset, overlapping rows such that there is no direct line of sight path from the inlet to the outlet of the conduit. This arrangement of the heat sink pins imparts a turbulent flow to the exhaust gases as the exhaust gases flow from the inlet to the outlet The overall geometric shape of the thermoelectric generator module is preferably such that the surface area of the top surface and the bottom surface of the device exceeds the surface area of the side surfaces of the device by a factor of two or higher. The rows of heat sink pins may be affixed to the top and bottom interior surfaces of the thermoelectric generator module to absorb heat energy from the exhaust gases and to thermally conduct the absorbed heat energy to the top and bottom interior surfaces of the thermoelectric generator module. The volumetric dimensions of the thermoelectric generator module are preferably selected such that the device can accommodate twice the volumetric capacity of the exhaust pipe or manifold, thereby minimizing exhaust system backpressure. The heat sink pins may be arranged geometrically to provide for a fluid dynamic porosity and permeability of 50% or higher.

The outlet of the thermoelectric generator module may have affixed thereto an aerodynamically contoured air foil. This air foil may be affixed, for example, at an angle at the edge of the outlet where the outlet is vented to the atmosphere. The air foil may take advantage of the air movement under the frame of the automobile such that the forward motion of the automobile will force air past the air foil. This may create a Venturi effect to assist in drawing the exhaust gases out of the thermoelectric generator module, thereby further minimizing exhaust system back pressure.

The outer surfaces of the top and bottom of the thermoelectric generator module may have a plurality of layers of thermopiles in an array affixed thereto via a thermally conductive adhesive and/or fixture. The thermopile array may be wired in series and/or parallel in wiring harnesses (which may be shielded in a conduit) to satisfy the specifications of the electrical system of the Stirling-Electric Hybrid Automobile. The heat energy from the heat sink pins on an interior surface of the module generator device may be conducted to the outer surfaces of the module generator device.

A cooling plate made of a thermally conductive material, may be affixed to the cold side of the thermopiles in the thermopile array via a thermally conductive adhesive and/or fixture. This thermally conductive material may include, but is not limited to, one or more materials selected from the group consisting of ceramics, ceramic composites, metallic alloys and metallic alloy composites that may include aluminum, aluminum alloys, aluminum composites with cubic boron nitride (Al (c-BN)), or equivalent materials with high coefficients of thermal conductivity. A cooling fluid may circulate to and from a radiator device through one or more channels provided in the cooling plate, thereby expelling excess waste heat energy to the external environment. The fluid may flow in a pattern (such as, for example, a serpentine pattern) to enhance heat absorption.

The radiator device is preferably constructed of one or more materials selected from the group consisting of thermally conductive ceramics, ceramic composites, metallic alloys and metallic alloy composites. The radiator device may be equipped with at least one fan which is driven by electricity or by mechanical means. Such mechanical means may include, but are not limited to, mechanical means which provide motive power to the fan for the purpose of forcing ambient air over, and/or through, the radiator device to expel excess waste heat energy conducted to the surfaces of the radiator device from the cooling fluid. These mechanical means may include at least one mechanical means selected from the group consisting of belts, cog wheels and other such devices. The radiator device may be part of the overall cooling radiator system of the Stirling-Electric Hybrid Automobile, or may be separate from the overall radiator cooling system.

An outer surface of the cooling plate may be affixed with a plurality of heat sink pins by a thermally conductive adhesive and/or fixture such that passive transfer of heat energy from a surface of the cooling plate to the heat sink pins is accomplished. The heat sink pins may expel excess waste heat energy passively as, for example, through air movement the under the frame of the vehicle which is generated by the forward motion of the vehicle. This air movement may act to force air over and/or through the arrangement of heat sink pins.

The use of heat sink pins is especially advantageous in the systems, devices and methodologies described herein. In particular, heat sink pins may offer superior heat transfer characteristics as compared to the heat transfer fins used in some prior art devices, due to a more favorable surface area to mass ratio of the former compared to the latter. Moreover, without wishing to be bound by theory, heat sink pins do not inhibit heat transfer by boundary layer effects, as is typically the case with the laminar fluid flow with the employment of heat transfer fins. In addition, the geometric configuration of the heat sink pins as described herein may improve heat energy transfer rates from the exhaust gases to the thermopile array by creating micro turbulent flow within the thermoelectric generator module. This may increase the residence time of the exhaust gas molecules within the thermoelectric generator module, thus allowing for a more complete heat energy transfer to the thermopile array while minimizing back pressure within the exhaust system.

Exhaust gas temperatures from an external combustion automotive Stirling Cycle engine are typically found to range from 150° C. to 250° C. when measured at the exhaust manifold. The current state of the art on thermopile power generation requires at least a 50° C. temperature difference ($\Delta T$) to generate power at optimum efficiencies. As previously noted, a Stirling Cycle engine has significantly lower exhaust gas temperature ranges than conventional internal combustion engines. This allows for a significant improvement in the performance of thermopiles used in conjunction with such an engine (as compared to their use with an internal combustion engine), since high temperature range thermopiles are not as efficient as lower temperature range thermopiles. Without wishing to be bound by theory, this is believed to be due, in part, to the greater ability to maintain more favorable thermal gradients from the hot side of the thermopile to the cold side of the thermopile at lower temperatures. The coefficients of thermal conductivity for materials which are stable at high temperatures have a lower rate of heat energy transfer at high temperatures than the same material has at lower temperatures. Essentially, there is an inverse relationship in the rate heat energy transfer such that, as temperatures drop, the coefficient of thermal conductivity of materials increases.

FIG. 1 is a diagrammatic view of the outlet end of a Thermoelectric Heat Energy Recovery Module (THERMO) Generator device for application in a Stirling-Electric Hybrid automotive application in accordance with a preferred embodiment of the systems and methodologies disclosed herein. The Thermoelectric Heat Energy Recovery Module Generator device preferably includes a conduit which allows for the flow of exhaust gases through the interior of the module generator device from the inlet to the outlet for venting to the atmosphere. This conduit is preferably tubular, but may have various other geometric shapes.

Opposite of the outlet, the inlet of the module generator device may be connected to the exhaust manifold (or to the exhaust pipe and/or other conduit) to transfer the exhaust gases of the module generator device before venting these exhaust gases to the atmosphere. The outlet of the module generator device may be vented to the atmosphere, or may be connected to one or more other Thermoelectric Heat Energy Recovery Module Generator devices (which may be arranged in series) before venting to the atmosphere. An interior surface (which may be an upper or lower interior surface) of the module generator device may have a plurality of varying length heat sink pins (5) affixed thereto. These pins may be arranged in a plurality of offset overlapping rows such that there is no direct line of sight flow path as the exhaust gases move from the inlet to the outlet of the module generator device. The geometric arrangement of the plurality of heat sink pins may be designed in such a manner as to achieve a porosity and permeability of 50% or higher from the inlet to the outlet.

One or more thermopile arrays (4) may be affixed, via a thermally conductive adhesive and/or fixture, to an outer surface of the module generator device to absorb heat energy from an outer surface of the module generator device. The plurality of thermopiles may be arrayed in various geometric arrangements and may be in a plurality of layers, may be wired in series, and/or may be wired parallel in accordance with the voltage specifications of the electrical system of the Stirling-Electric Hybrid Automobile. The wiring may be bundled into a conduit and/or wiring harness (6) to connect the wiring to the electrical system of the Stirling-Electric Hybrid Automobile.

A cooling plate(s) (2) may be affixed via thermally conductive adhesive and/or fixture(s) to the outer most surface(s) of the thermopile(s) array(s) (4) in such a manner as to absorb heat energy from the surface(s) of the thermopile(s) arrayed on the surface(s) of the module generator device. The cooling plate(s) may have a plurality of tubular channels, both internal and external, (3) through which cooling fluid may flow in a pattern (which may include, but is not limited to, a serpentine pattern) such that the cooling fluid circulates through the majority of the mass, and/or area, of the cooling plates. This circulation of cooling fluid will be augmented by external tubular return loops (3) to conduct the cooling fluid through the cooling plates. The circulating fluid may be pumped actively to and from the radiator through the cooling plates via a cooling fluid inlet and a cooling fluid outlet, which may be part of the overall radiator cooling system, or separate from the overall radiator cooling system.

A plurality of heat sink pins (1), of varying length, may be affixed to one or more outer surfaces of the cooling plate and may be geometrically arranged in offset overlapping rows and of varying lengths. These heat sink pins may utilize air movement under the frame of the Stirling-Electric hybrid Automobile (as the vehicle moves forward) to expel heat energy derived from the module generator device to the ambient air.

One or more air foils may be attached to the sides of the module generator device to direct air flow past the outlet end of the module generator device (7) which is affixed to the outermost surface of the module generator device via a bracket (8) and/or other fixture to allow for air flow past the air foils.

Figure 2:
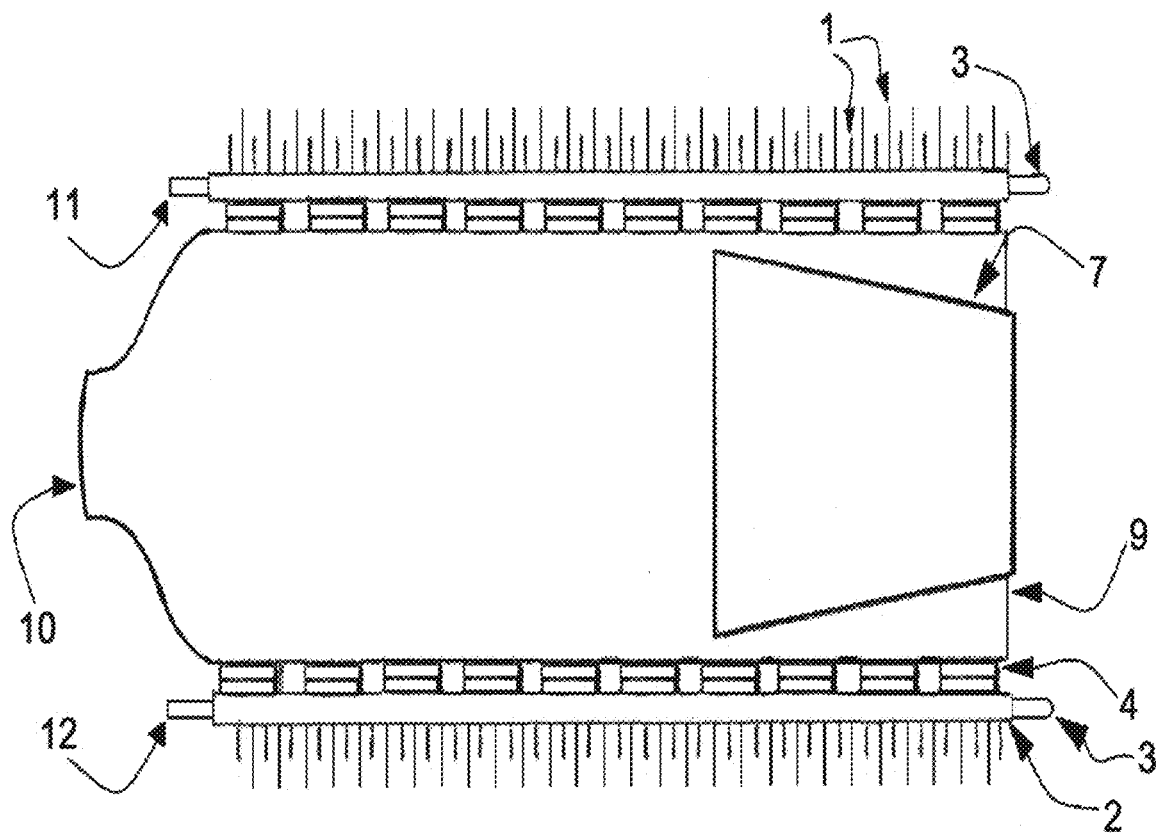
FIG. 2 is a lateral view of a diagrammatic representation of a module generator device.

FIG. 2 is a lateral view of a diagrammatic representation of the module generator device. The inlet end (10) of the module generator device is preferably affixed to an exhaust pipe, exhaust manifold and/or other conduit device to transfer hot exhaust gases to the interior of the module generator device for venting to the atmosphere via the outlet (9) of the device. The thermopile arrays (4) are affixed to the outermost surfaces of the module generator device. The cooling plate (2) is affixed to the outermost surfaces of the thermopile arrays (4) via a thermally conductive adhesive and/or via one or more fixtures. The cooling plate is equipped with one or more tubular return loops (3) to conduct circulating fluid through the tubular channels of the cooling plate via the circulating fluid inlet (11), and then via the tubular return loops (3) to the fluid outlet (12). An air foil (7) is attached to the side of the module generator device to direct air flow past the outlet end of the module generator device.

Figure 3:
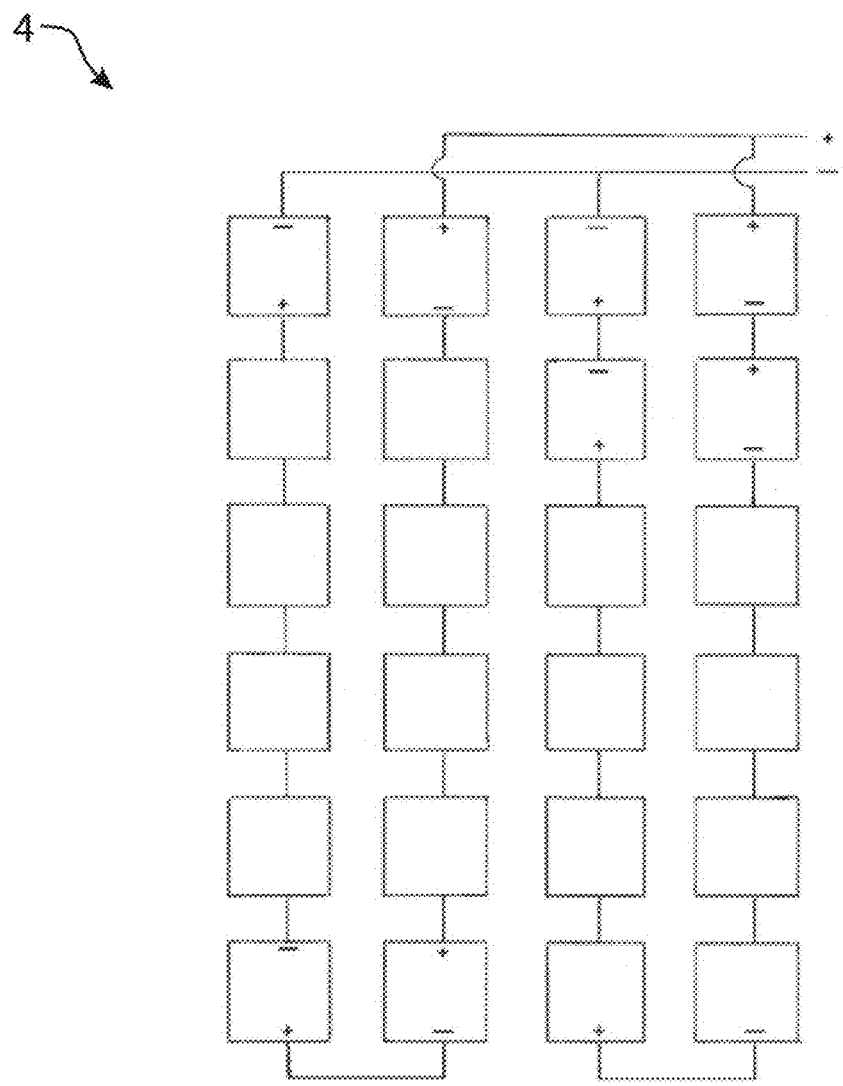
FIG. 3 is a diagrammatic representation of the plurality of thermopile arrays affixed to an outer surface of a module generator device which is wired in series, and/or parallel, to meet the electrical specifications of the electrical system of the Stirling-Electric Hybrid Automobile.

FIG. 3 is a diagrammatic representation of a plurality of thermopile arrays affixed to the outer surfaces of the module generator device. The thermopile arrays may be wired in series and/or in parallel to meet the electrical specifications of the electrical system of the Stirling-Electric Hybrid Automobile. The wiring may be bundled into a conduit to carry the electrical power to the electrical system of the Stirling-Electric Hybrid Automobile. The plurality of thermopile arrays may be arranged in a plurality of layers.

Figure 4:
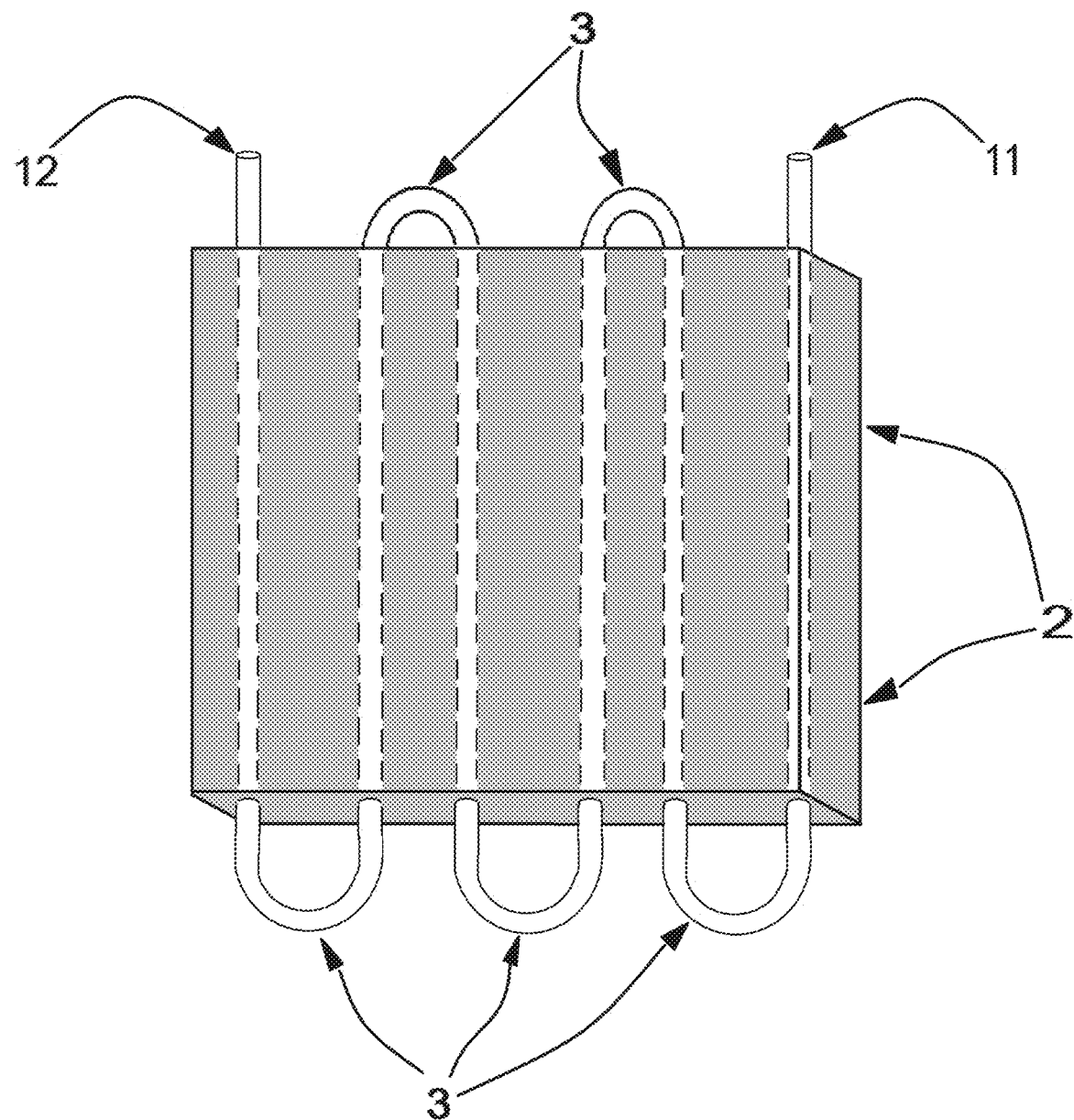
FIG. 4 is a diagrammatic representation of a cooling plate with a tubular channel therein for the circulation of cooling fluid.

FIG. 4 is a diagrammatic representation of the cooling plate (2) with a tubular channel for the circulation of cooling fluid (which may circulate in a pattern to include, but not limited to a serpentine pattern) to and from a radiator device via the cooling fluid inlets (11) and cooling fluid outlets (12) of the cooling plate(s) to expel excess waste heat energy. The pattern of serpentine circulation of the cooling fluid within the cooling plates (2) is augmented by return loops tubes (3) at either end of the cooling plate(s) (2) until the cooling fluid exits the cooling plate (2) via the cooling fluid outlets (12).

Figure 5:
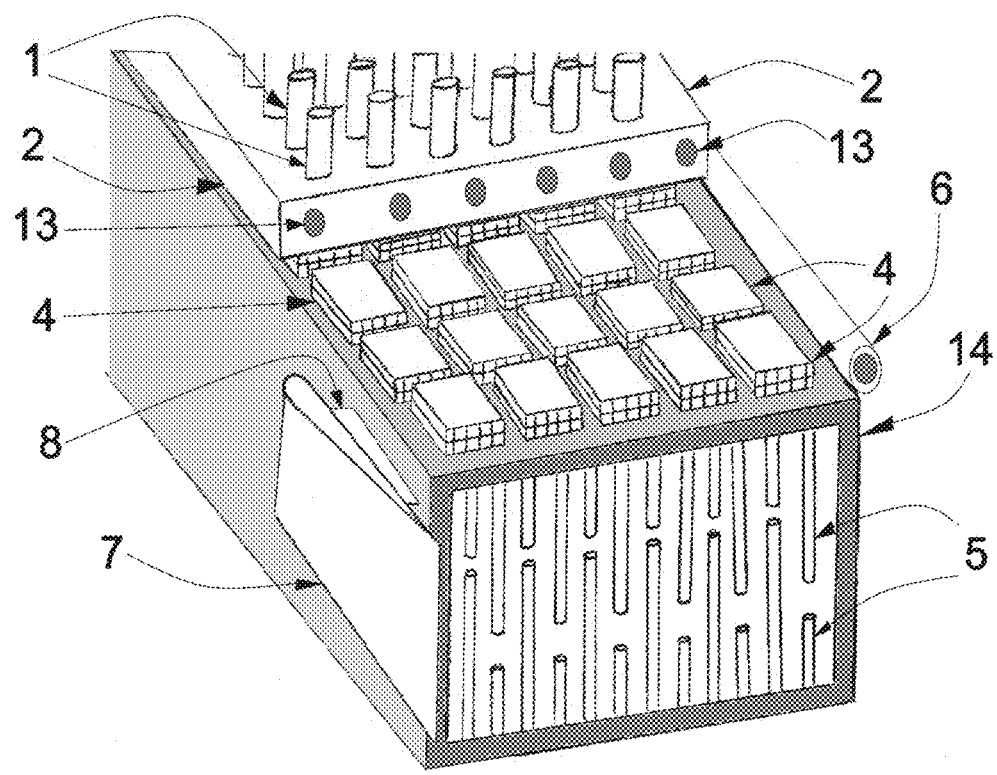
FIG. 5 is a layered, cut away diagrammatic representation of an outlet surface of a module generator device which is in direct contact with thermopiles arrayed in a plurality of layers.

FIG. 5 is a layered cut away diagrammatic representation of the outlet (14) surfaces of the module generator device in direct contact with the thermopiles (4) arrayed in a plurality of layers. The cut away diagrammatic representation shows the cooling plate (2) in direct contact with the thermopile array (4). The wiring of the thermopile array may be bundled into one or more conduits and/or wiring harnesses (6) to connect with the electrical system of the Stirling-Electric Hybrid Automobile. Heat sink pins (1) are diagrammatically represented having direct contact with the outer surfaces of the cooling plate (2) which have tubular channels (13) for the circulation of cooling fluid.

The outermost surfaces of the thermopile array (4) are in direct contact with the cooling plate (2), the outmost surfaces of which are affixed to the outermost surface layers between the interior and exterior of the module generator device. An air foil (7) is affixed to the lateral side of the module generator device. The air foil (7) is affixed with a bracket and/or fixture (8) to direct air flow past the outlet of the module generator device. The interior surfaces of the module generator device are affixed with a plurality of heat sink pins (5) of varying length, arranged in a plurality of rows with each row offset one from the other.

The foregoing device is Stirling-Electric Hybrid automotive exhaust module generator device for converting waste heat energy into electrical energy by employing the Thermoelectric Effect (also known as the Seebeck Effect). The present disclosure describes how this device converts heat from hot exhaust gases from the operation of an automotive external combustion engine (e. g. Stirling Cycle engine) into electrical energy, which is fed back into the electrical system of the Stirling-Electric Hybrid Automobile, thus minimizing losses due to the second law of thermodynamics. This device may be advantageously utilized with Stirling Cycle engines such as those described in U.S. Pat. No. 7,726,130 (McDowell), which is incorporated herein by reference in its entirety.

Preferred embodiments of the systems, devices and methodologies disclosed herein utilize of the first law of thermodynamics by increasing residence time of the hot exhaust gases through the module generator device by employing heat sinks, in the form of a plurality of pins, on the interior surfaces of the module generator device. Additional improvements may be implemented by employing materials with higher coefficients of thermal conductivity such as, for example, ceramics, ceramic composites, metal alloys and/or metal alloy composites. The use of these materials may improve the overall rate of heat transfer of the module generator device surfaces.

As exhaust gases move from the inlet of the module generator device to the outlet, the pins of the heat sink create micro-turbulences such that micro-vortices and turbulent flow move the exhaust gas molecules over more heat transfer surface areas of the module with a resultant improvement in heat energy transfer than can be currently attained with heat transfer fins (due to the boundary layer effect typical in laminar fluid flow). Additionally, this configuration of the plurality of heat sink pins may resolve the problem of creating back-pressure in the exhaust system that is inherent in heat transfer fin designs due to laminar fluid flow boundary layer effects. The plurality of the heat sink pins transfers the heat energy to the outer surfaces of the module, where a plurality of thermopiles are wired (in series and/or parallel bundles) to meet the voltage specifications of the electrical system. The plurality of the thermopiles are preferably disposed in an array and may be affixed to the hot outer surfaces of the exhaust module device. Consequently, the thermopiles may be in direct contact with the outer surfaces of the module device via thermally conductive adhesives and/or fixtures to provide for heat energy transfer via thermal conduction. The thermopile arrays may be in a plurality of layers, wherein each layer is in direct contact with the adjacent layer to transfer heat energy, one from the other, by thermal conduction. One or more cooling plates may be affixed in direct contact to the outer surfaces of the thermopile arrays with a thermally conductive adhesive and/or fixture to provide for heat energy transfer via thermal conduction.

The cooling plates may comprise a thermally conductive material which may include, but is not limited to, ceramics, ceramic composites, metal alloys and/or metal alloy composites. The cooling plates provide for a significant ΔT between the surfaces of the thermopile arrays, which are in direct contact with the outer surfaces of the module generator device and the cooling plate surfaces such that an electrical voltage is generated when a minimum threshold ΔT is achieved.

The cooling plates may transfer heat energy from the thermopile arrays to the ambient air, both actively and passively. Active cooling may be provided by the employment of a serpentine arrangement of tubular channels in the cooling plates, through which cooling fluid circulates to and from the cooling plate via a radiator to expel heat energy from the circulating fluid to the ambient air. Passive cooling may be accomplished by affixing a plurality of heat sink pins to the outer surface(s) of the cooling plates to take advantage of the air movement under the vehicle frame, to expel heat to the ambient air, as the automobile moves along the roadway.

The technical problems that the preferred embodiments of the systems and methodologies disclosed herein set out to resolve are not limited to the ones mentioned herein, and those technical problems that are not mentioned shall be clearly understood by a person skilled in the art by examining the present disclosure.

In order to facilitate a better understanding of the systems, devices, methodologies and platforms disclosed herein, specific embodiments of have been disclosed herein, and specific components of these devices may have been identified including, in some instances, specific models and types of these components, and specific attributes or performance characteristics possessed by these components. However, unless otherwise indicated, the systems, devices, methodologies and platforms disclosed herein are not limited to these specific models or types, or to components having the specific recited attributes or performance characteristics.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Unless otherwise indicated, the use herein of the conjunctive "or" shall be construed inclusively. Thus, for example, the phrase "A or B" shall be construed to include only A, only B, and A and B.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

In the following claims, unless indicated otherwise in the specification, the elements in different dependent claims may be combined without departing from the scope of the invention. For example, if claim X has claims X1 and X2 dependent thereon, and if claims X1 and X2 recite, respectively, elements A and B, then both of elements A and B may be added to claim X without departing from the scope of the invention.

What is claimed is:

1. A thermoelectric heat energy recovery module in combination with a Stirling cycle engine equipped with an exhaust line, said heat energy recovery module comprising:
    a conduit having a wall and equipped with an inlet and an outlet, wherein said inlet and outlet are in fluidic communication with each other by way of an interior space enclosed by said wall, wherein said inlet is fluidically coupled to the exhaust line of the Stirling cycle engine, and wherein said outlet is in fluidic communication with an environment external to said wall; and
    first and second sets of heat sink pins which extend from said wall and into said interior space in first and second opposing directions, respectively;
    wherein said first and second sets of heat sink pins are disposed in first and second opposing arrays, respectively, wherein each of said heat sink pins in the first array is disposed in an opposing and spaced-apart relationship to one of said heat sink pins in the second array, and wherein the heat sink pins in the first and second arrays are arranged in rows such that any two of said heat sink pins in each row which are adjacent to each other have different lengths as measured by the distance each of said heat sink pins extends from the wall.

2. The combination of claim 1, wherein said inlet and said outlet are disposed on opposing ends of said conduit.

3. The combination of claim 1, wherein said exhaust line has a first volume ($V_1$), wherein said interior space has a second volume ($V_2$), and wherein $V_2 \geq V_1$.

4. The combination of claim 1, wherein said interior space has a permeability of at least 50%.

5. The combination of claim 1, wherein said conduit has an external surface, and further comprising:
    a plurality of thermopiles which are in thermal communication with said external surface.

6. The combination of claim 1, wherein said conduit has at least one cooling plate disposed on an external surface thereof, and further comprising:
    a plurality of thermopiles which are in thermal communication with said at least one cooling plate.

7. The combination of claim 6, wherein said plurality of thermopiles are provided with a moisture resistant seal.

8. The combination of claim 6, further comprising a cooling plate, wherein said plurality of thermopiles are in thermal contact with said cooling plate.

9. The combination of claim 8, wherein said cooling plate has a plurality of tubular channels therein.

10. The combination of claim 9, wherein said plurality of tubular channels are in fluidic communication with each other by way of at least one return loop.

11. The combination of claim 9, wherein adjacent channels in said plurality of tubular channels are in fluidic communication with each other by way of a return loop.

12. The combination of claim 11, further comprising a coolant which flows through said plurality of tubular channels, and wherein each return loop transfers the coolant from a first of two adjacent channels to a second of the two adjacent channels.

13. The combination of claim 12, wherein said cooling plate is equipped with a fluid inlet and a fluid outlet, and wherein said fluid inlet and said fluid outlet are in fluidic communication with said plurality of tubular channels.

14. The combination of claim 13, further comprising a radiator, wherein said radiator is in fluidic communication with said fluid inlet and said fluid outlet.

15. The combination of claim 14, further comprising a circulating pump which circulates said coolant between said cooling plate and said radiator.

16. The combination of claim 15, further comprising a fan which drives air through said radiator.

17. The combination of claim 12, further comprising a third set of heat sink pins of varying length which are affixed to an exterior surface of said cooling plate.

18. The combination of claim 17, wherein said third set of heat sink pins are disposed in an array having a plurality of rows, wherein the heat sink pins in each row have a uniform height, and wherein the heights of said heat sink pins in any of said two adjacent rows are different.

19. The combination of claim 1, wherein said heat recovery module is equipped with a lateral wall having said outlet disposed therein, and further comprising an airfoil disposed on said lateral wall which directs air toward said outlet when said automobile is in motion.

20. A hybrid automobile comprising the combination of claim 6, wherein said hybrid automobile is equipped with an electrical system, and wherein said plurality of thermopiles are in electrical communication with said electrical system.

* * * * *